United States Patent [19]
Brewer et al.

[11] Patent Number: 5,479,593
[45] Date of Patent: Dec. 26, 1995

[54] SYSTEM AND METHOD FOR IMPROVED SOLVING OF EQUATIONS EMPLOYED DURING PARAMETRIC GEOMETRIC MODELING

[75] Inventors: Penny Brewer; Jon Stevenson, both of Huntington Beach, Calif.

[73] Assignee: Electronic Data Systems Corporation, Plano, Tex.

[21] Appl. No.: 81,741

[22] Filed: Jun. 21, 1993

[51] Int. Cl.$^6$ .................................................. G06T 11/20
[52] U.S. Cl. ........................................................... 395/141
[58] Field of Search ................................. 395/118, 141; 364/729, 730, 731, 735

[56] References Cited

PUBLICATIONS

Pabon, et al., "Integrating Parametric Geometry, Features, and Variational Modeling for Conceptual Design", International Journal of Systems Automation: Research and Applications, vol. 2, 1992, US, pp. 17–36.

Derman, et al., "HEQS—A Hierarchical Equation Solver", AT & T Technical Journal, vol. 64, No. 9, Nov. 1985, New York, US, pp. 2061–2096.

Chung, et al., "Technical Evaluation of Variational and Parametric Design", Proceedings of the 1990 ASME International Computers in Engineering Conference and Exposition, Aug. 5, 1990, US, pp. 289–298.

*Primary Examiner*—Mark K. Zimmerman
*Attorney, Agent, or Firm*—L. Joy Griebenow

[57] ABSTRACT

A system and method for generating a parametric profile of an object to be modelled is shown which receives input from a user in the form of equations, generates further equations inherent to a profile definition, prioritizes the equations into ranked classes, sorts the prioritized equations to thereby create an ordered solved equation list, solves the sorted equations in the order they appear on the solved equation list and generates a profile of geometry entities constructed from the solutions of the solved equations. The system and method automatically constrain unknown variables within any under-populated equation sets based on heuristics and employ any redundant equations to determine and resolve conflicts among the equations to be used for generating the profile.

18 Claims, 4 Drawing Sheets

SYSTEM AND METHOD FOR IMPROVED SOLVING OF EQUATIONS EMPLOYED DURING PARAMETRIC GEOMETRIC MODELING

BACKGROUND OF THE INVENTION

1. Field of the Invention

The present invention relates generally to computer-aided design and computer-aided engineering, and more particularly to a system and method for improved parametric geometric modeling.

2. Description of the Related Art

In geometric modeling systems, such as those found in computer-aided design (CAD) products, a user is able, for example, to describe two-dimensional geometric shapes by using a profile to describe the cross-section of a feature of an object. A profile is either a closed continuous two-dimensional region used to generate a solid object or, if the profile is used to generate a surface, the profile would be a continuous set of two-dimensional curves. A profile is used to generate a more complex three-dimensional geometric shapes by sweeping or extruding the cross-section it describes. Moreover, a user of solid modeling can sweep two different profiles that lie in two different planes and intersect, unite or subtract one swept profile from the other extrusion to generate a more complex three-dimensional shape.

It often occurs that a geometric profile used to describe an object, such as a mechanical part, must be modified as the design of the object changes. It is desirable that this modification be done by affecting values used to describe characteristics of the profile rather than having to directly respecify the geometry of the profile. Thus, a user may edit parameters of equations in the equation set of a sketch by editing dimensions directly, with the system regenerating the associated dimensions and constraint equations. The ability to perform this type of modification is termed parametric geometric modeling.

Computerized systems which enable a user to perform parametric geometric modeling typically employ an equation solver to solve series of algebraic equations describing the geometric profiles. Such equation solvers have been described in literature and have employed one of two approaches: a numerical algorithm utilizing Newton-Raphson techniques or a constructive algorithm simulating rule and compass construction. An example of the latter is found in Chung, J. C. H. and Schussel, M.D., "Comparison of Variational and Parametric Design", Mechanical Engineering Systems, Auerbach Publishers.

It is often necessary to modify the profile values used to describe sketch characteristics when the set of equations used to describe the profile is under- or over-populated. However, both of the equation solving approaches mentioned above have inherent disadvantages when applied to algebraic equations sets which are under- or over-populated. A set of equations is deemed under-populated when the set of equations is insufficient to define the associated geometry described by such set of equations. Similarly, a set of equations is deemed over-populated when there are more equations in the set than necessary to define the associated geometry described by the equations.

The constructive algorithm approach is unable to determine a non-imaginary solution (root) to a set of under-populated algebraic equations. Moreover, such approach cannot prioritize equations and select an appropriate and desirable solution to a set of over-populated equations. The numerical algorithm approach, on the other hand, not only suffers from the same inherent disadvantages set forth with regard to the constructive approach, but is further unable to employ heuristics to select the most appropriate solution for an object design from a finite set of solutions.

SUMMARY OF THE INVENTION

In view of the above problems associated with the related art, it is an object of the present invention to provide a system and method for solving equations sets which characterize parametric geometric profiles and enable a user to modify an object as the design of the object changes by modifying the values used to describe characteristics of the profile rather than directly respecifying the profile geometry.

It is another object of the present invention to provide a system and method for determining a non-imaginary solution to a set of under-populated algebraic equations and for modifying the values used to describe profile characteristics when the set is not fully populated.

It is a further object of the present invention to provide a system and method which applies heuristics to those equations to determine desirable solutions to an over-populated set of equations.

A further object of the present invention is to provide a system and method for solving equations describing geometry which prioritizes the equations to prefer user-defined equations over equations inferred by the system.

In the accomplishment of these and other objects, a system and method are described which uniquely solve a set of algebraic equations describing two-dimensional geometric profiles or the projections of three-dimensional profiles of objects onto a two-dimensional plane. Because the shape of the profile is controlled by the solution obtained from the set of algebraic equations, the present invention modifies values used to describe characteristics of the profile, and thereby modify the profile shape.

The system and method for generating a parametric profile of an object to be modelled according to the present invention receives input from a user in the form of equations, generates further equations inherent to a profile definition, prioritizes the equations into ranked classes, sorts the prioritized equations to thereby create an ordered solved equation list, solves the sorted equations in the order they appear on the solved equation list and generates a profile of geometry entities constructed from the solutions of the solved equations. The system and method automatically constrain unknown variables within any under-populated equation sets based on heuristics and employ any redundant equations to determine and resolve conflicts among the equations to be used for generating the profile.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 4a is a schematic illustration of an example overpopulated class of equations, while

DETAILED DESCRIPTION OF THE PREFERRED EMBODIMENT

As a matter of background, an equation may have the following status: unsolved (more than one variable in the equation is unknown), solved (exactly one variable in the equation is unknown) or redundant (every variable in the equation is known).

Figure 1:
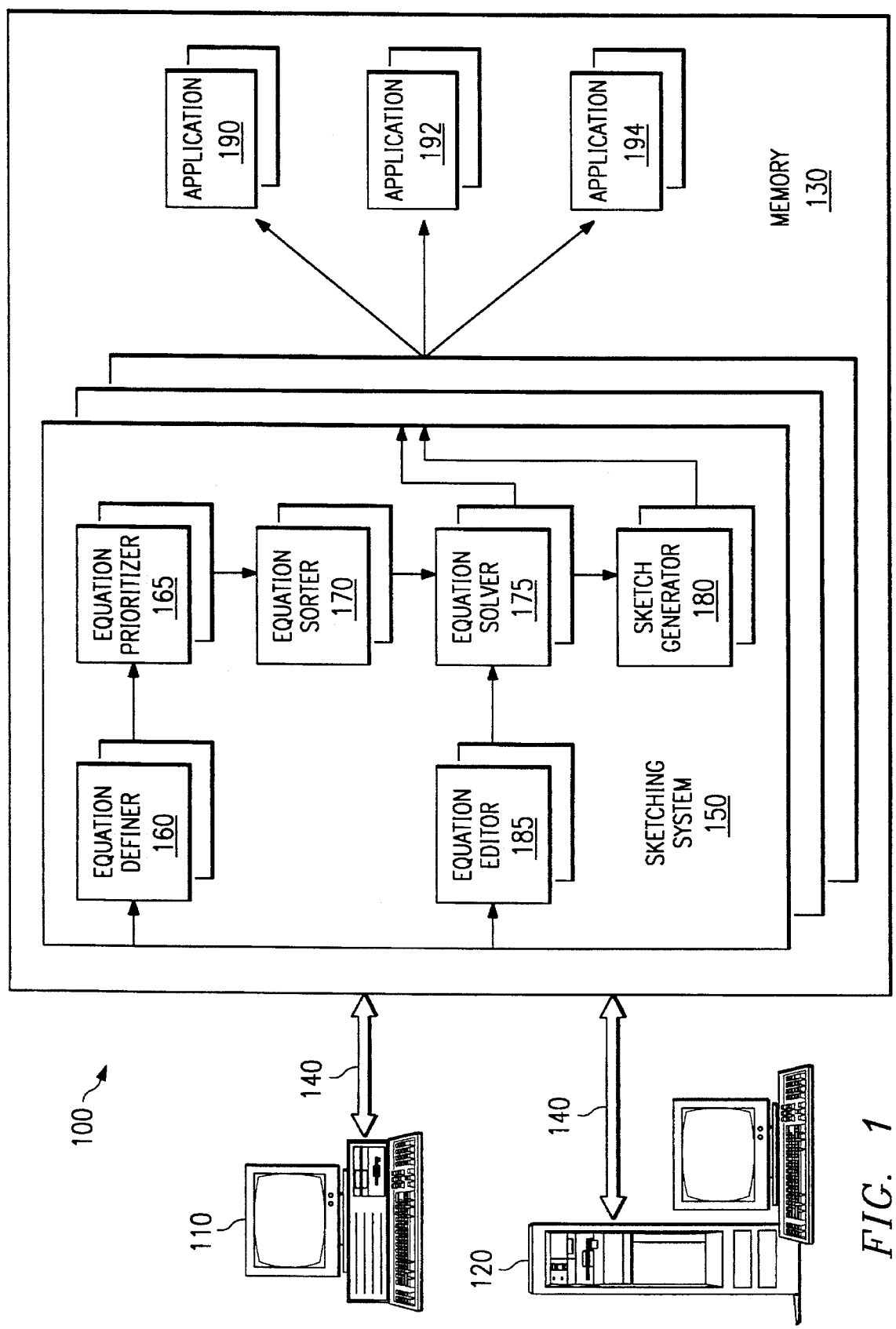
FIG. 1 is a schematic representation of an example processing system incorporating the present invention.

Consider first FIG. 1, which shows a schematic representation of an example processing system 100 employing the present invention. Processing system 100 incorporates at least one workstation or client/server or PC (personal computer) 110 (hereinafter referred to only as workstation 110 for ease of understanding) and/or at least one mainframe computer 120. Because the exact composition of workstations and mainframes are well-known, they will not be described herein.

There is a CAD system of the user's choice, which are also well-known in the art, such as a commercial turnkey CAD/CAM system like Unigraphics® (a registered trademark and product of Electronic Data Systems Corporation) residing on workstation 110 and/or mainframe 120, depending upon the particular configuration of processing system 100. Such CAD system includes a system equation sketcher and can generate two-dimensional drawings and/or three-dimensional solid models.

A user first enters geometric and dimensional constraints into equation definer 160 to define a set of relationships forming a desired object to be modeled. This input is normally in the form of equations. The CAD system directs processing system 100 to access memory 130 via bus 140 to reach sketcher system 150. Based on the input it receives, sketcher system 150 in equation definer 160 infers certain geometric and/or dimensional relationships, also in the form of equations defining relationships among variables. Thus sketcher system 150 generates all of the equations inherent to the definition of the profile via equation definer 160 either by considering the geometry or by taking the constrained input. The user does not deal with the equations inherent to the definition directly; those equations (axiom as well as system-inferred) are transparent to the user. All of the relevant equations are then presented to equation prioritizer 165 which prioritizes the equations and passes the prioritized equations to equation sorter 170 for sorting. Once the equations are sorted, they are then solved by equation solver 175 which produces a profile of the desired object as output to sketch generator 180 or to applications 190,192,194 for further processing. Sketch generator 180 of sketcher system 150 uses the profile to generate a sketch of the desired model. This sketch can be output to workstation 110 and/or mainframe 120, or it can be provided to applications 190, 192,194 for additional processing. Equation editor 185 enables a user to change one or more constraints of a profile via bus 140 from workstation 110 and or mainframe 120. Such changes are provided to equation solver 175 which resolves relevant affected equations and generates a new profile based thereon.

Figure 2:
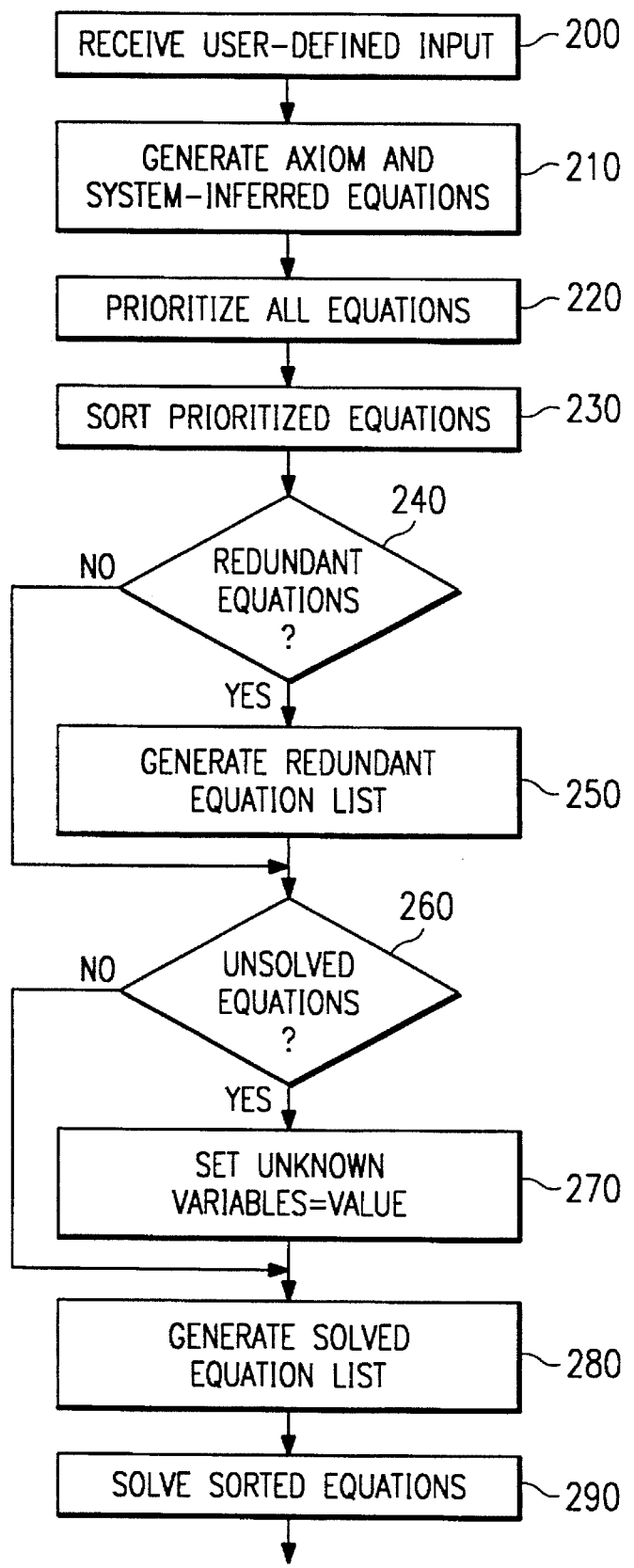
FIG. 2 is a flowchart of a preferred embodiment of the present invention.

FIG. 2 shows a flowchart of a preferred embodiment of the present invention. At Block 200 the system receives all userdefined input, normally in the form of equations containing geometric and/or dimensional constraints. Once the system has received such user-defined input, it preferably generates axiom and system-inferred equations in response thereto (Block 210). After the system has completed generating these equations inherent to the definition of the desired geometric object to be modelled, the system gathers both the user-defined input and the system-generated equations into a single set of equations to be solved.

According to the present invention, the set of equations to be solved is preferably first prioritized (Block 220). In order to prioritize the solving of equations, the equations used to describe the geometric configuration of the model are divided into classes: axiom equations, user-defined equations and system-inferred equations.

Axiom equations are fundamental equations intrinsic to the geometry that they describe, are always true, and define a specific geometry such as an arc, a circle, a line, and the like. User-defined equations are equations prescribed by the user. Illustrative examples of user-defined equations include: specified angles are certain degrees in measurement, or two variables are a specified distance apart, or two arcs have the same radius except one is three inches shorter in length than the other, etc. It should be understood that both axiom and user-defined classes of equations describe geometric constraints (e.g., parallel lines) or dimensional constraints (e.g., radial dimension). System-inferred equations are geometric constraints that the computing system infers. For example, if lines drawn are about the same length, the system will infer that the lines are the same length.

Axiom equations are preferably accorded Class=0 (most-favored) status, while user-inferred equations and system-inferred equations can be found in Class=1 and Class=2, respectively. According to a preferred embodiment of the present invention these geometric configuration equations are solved in the following order—Class=0, then Class=1, and finally Class=2—if the desired geometric configuration is to be attained.

The chief benefit resulting from prioritizing the equations is that user-defined equations take precedence over equations inferred by the system. For example, if the user drew two circles with close-to-equal radii, the system infers that the radii are indeed equal. If the user also defined that one circle's radius is two inches less than the other's radius, the system-inferred constraint that the radii are equal preferrably will be ignored by the system when it later generates the geometric model.

As preprocessing for the equation solver, the set of equations associated with a sketch are re-ordered and the individual equations rewritten in such a form that they may be solved individually. This process is called equation sorting (FIG. 2, Block 230) and uses the following nomenclature for a set of equations:

$$F1(V_i(a), V_j(b), \ldots)$$

$$F2(V_k(c), V_l(d), \ldots)$$

$$F3(V_m(e), V_n(f), \ldots)$$

where a, b, c, d, e, f are integers (specifically, 1, 2, or 3) and $V_i$, $V_j$, etc., are variables associated with a sketch.

An ordered (linked) list of solved equations (hereinafter referred to as a solved equation list) is built using the criteria that an equation may be added to the list if a single variable in the equation can be isolated. The sorter stops when it is not possible to add another equation to the solved equation list. The sorting capability of the present invention is better described with the following exemplary pseudo-code:

```
10 continue
    Loop over equations not yet on list
        ***If equation has only one unknown, and the
        ***equation may be rewritten such that the single
        ***unknown is isolated, then the equation is
        ***rewritten and put on the solved list.
    Endloop
    If at least one equation was put on during the last loop,
    then
        goto 10
    else
        continue
    endif
        ***The sorting process is complete.
```

Through the process of equation sorting, the present invention builds the solved equation list which is a directed acyclic graph relating the characteristic data of geometry to the characteristic data of other geometry. Axiom equations ensure that only the minimum set of data needs to appear in the solved equation list for a geometry entity to be "known". Any variable that is not isolated in an equation on the list is "unknown". If there are no unknown variables, then the profile of the sketch is "fully constrained", otherwise the profile of the sketch is "under-constrained".

The solved equation list is derived by first cycling through the equations individually within a class of equations. It should be understood cycling refers to the system of the present invention proceeding through each of the equations in a class until the system has added all equations which have only one unknown variable to the solved equation list before proceeding to the next class.

Generally the system of the present invention proceeds through the Class=0 equations until all solved equations have been moved onto the solved equation list, leaving any remaining unsolved equations for later consideration. The system then proceeds to Class=1 and again moves all solved equations onto the solved list, again skipping unsolved equations in the class. The instant the system moves the very first system-inferred equation (Class=2) to the solved equation list, the system immediately returns to the remaining equations within Class=0. The system cycles through the class seeking more solved equations to add to the solved equation list now that other equations have been added to the solved equation list. The system cycles through the Class=0 until no more equations can be added to the solved equation list, and then proceeds to cycle through the Class=1 equations until no more equations can be added to the solved list. At this time the system increments to Class=2 and proceeds through the system-inferred equations until it finds one that can be moved to the solved list, whereupon it promptly returns to the remaining Class=0 set of equations and the process repeats. This process continues until all equations that can be solved, regardless of class and excepting redundant equations as described below, have been moved to the solved equation list.

Figure 3:
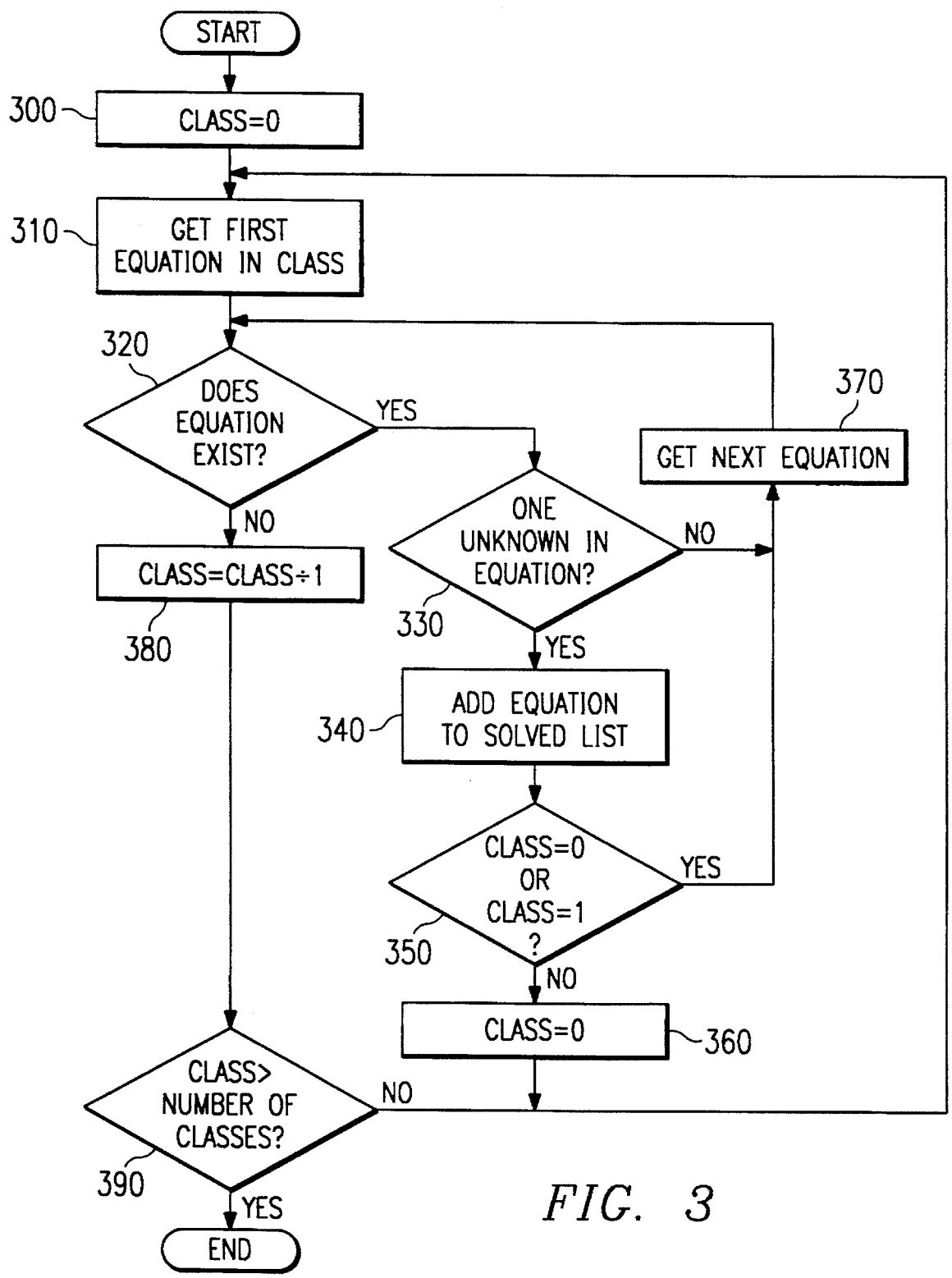
FIG. 3 is a more detailed flowchart of the sort equations portion of the flowchart of FIG. 2 according to an embodiment of the present invention.

Specifically, consider now FIG. 3 which illustrates a more detailed flowchart of the sort equations portion of the FIG. 2 flowchart according to a preferred embodiment of the present invention. At Block 300 the system starts with the Class=0 (axiom) equations. It obtains the first equation in the class at Block 310. If there is an equation in the zero class (Decision block 320) the present system determines whether there is only one unknown in the equation (Decision block 330). If not, the system skips this equation, gets the next equation (Block 370), and returns to Decision block 320. If the equation does have only one unknown, the equation is added to the Solved List (solved equation list) at Block 340. At Decision block 350 the system checks whether it is still in either the zero or first classes. If so, it proceeds to Block 370 to get the next equation.

Had there been no equation or no next equation available in the axiom class, the system would have proceeded to Block 380 where the class counter is incremented. At Decision block 390 the system determines whether it is finished with all of the classes. If so, it exits to Block 290 of FIG. 2 where the sorted equations are solved by the system. However, in the present example, the system is not finished and it proceeds to get the first equation in the next class (Class=1). The system again proceeds to check each equation for those with only one unknown, moving those which qualify onto the Solved List. Once the system has cycled through all of the equations in Class=1, it continues at Block 380 to increment the class counter, determine whether it is finished (in this case it is not) and proceed to get the first equation from Class=2.

After cycling through the list of equations within Class=2 until it finds an equation with only one unknown and adding same to the solved list, the system ascertains it is in Class=2. It sets the class counter to Class=0 and returns to check the equations it originally skipped in the axiom class to determine whether any of them now contain only one unknown as a result of the equations currently on the solved equation list. As before the system cycles through both of the Class=0 and Class=1 sets of equations before returning to Class=2. Each time the system puts a Class=2 equation onto the solved equation list, it promptly returns to the Class=0 and Class=1 equations to see if any of the remaining equations in those classes can now be moved onto the solved list. This process continues until all of the equations which can be moved to the solved list, have been so moved.

Figure 4A:
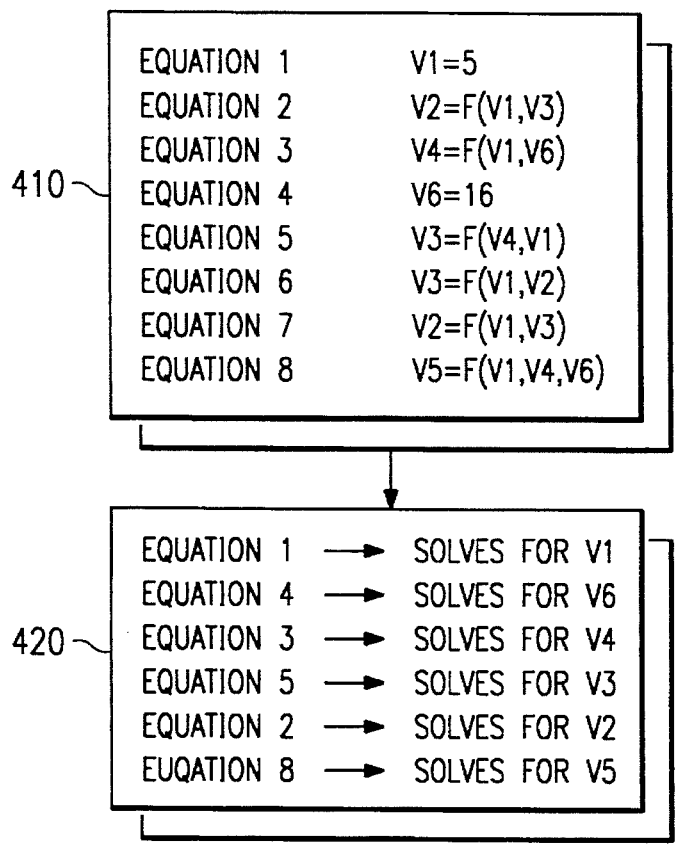

FIG. 4a schematically illustrates an example over-populated set of equations 410, together with its respective solved equation list 420 according to a preferred embodiment of the present invention. For the sake of discussion, it will be assumed that such set of equations has been prioritized and includes all classes of equations, including axiom, system-inferred and user-defined equations. It should be understood that the order within the classes of these equations is not important. The system appraises each equation of set 410. If an equation only has one unknown, it gets added to solved equation list 420, which is an ordered list of equations used to define the geometry of a model. If the equation has more than one unknown, the equation is skipped and the system moves on to appraise the next equation.

As can be seen from the example in FIG. 4a, equation one has one unknown, so the system automatically places equation one onto solved equation list 420, and indicates that equation one can be solved for variable one. The system proceeds to equation two. Since equation two has two unknowns, the system skips equation two leaving it on list of unsolved equations 410. The system proceeds to the next equation. Equation three has two unknowns, so the system skips equation three as well. The fourth equation on the list has one unknown (namely variable six) so the system adds equation four to solved equation list 420. As can be seen, equation five also has two unknowns, thus the system skips equation five. This process is continued until the system arrives at an ordered list, namely solved equation list 420, as shown.

As can be seen, though equations six and seven are solved equations, they are also redundant equations. Any equation that contains no unknown variables is considered "redundant" and is not moved onto the solved equation list.

Therefore, the system determines equations six and seven are redundant equations (FIG. 2, Decision block 240) and adds them onto the redundant equation list (FIG. 2, Block 250), instead of solved equation list 420, which redundant equation list is set off to the side for processing after the sorting is completed. Because all of the variables are already known from the equations on solved equation list 420, the redundant equations are not used, which means set of equations 410 is an example of an over-populated set of equations.

Until the present invention, a sketch-solving system could not continue processing if there were redundant equations and such a system could not just ignore the redundant equations. This is because, unlike the system according to the present invention, such systems cannot determine which equations are redundant or advise the user of the existence and effect of having these redundant equations in the system.

The system preferably employs any redundant equations to double check to the extent possible that the values on the solved equation list are accurate or that there are no conflicts between equations. This is accomplished by taking each of the redundant equations and plugging in all but one value per variable. Therefore, in the present example, the solved values from the solved equation list are plugged into equation six to see whether the value obtained for variable V3 is the same using equation six as equation five provides.

If every redundant equation generates a value which corresponds with the solved value, the set of equations is considered completely defined or "constrained". On the other hand, a redundant equation is considered "conflicting" if the value obtained from an equation from the solved equation list is not the same as that obtained from a redundant equation for the same variable. Therefore, if the system establishes that there is conflicting information by employing the redundant equation(s) in this fashion, the system then preferably ascertains whether the conflicting information is between user-defined equations or between a user-defined equation and a system-inferred equation. An illustration of the former might be if, say, the user defines the radius of arc two as twice the radius of arc one in one equation and defines the ratio of the radii as 3:1 in another equation. In this situation, one of the equations would be on the redundant list and would come up with a different value than the equation on the solved equation list. The system would then provide a message to the user that these equations are conflicting and provide the specific conflicting equations.

However, if the conflict is between a user-defined equation and a system-inferred equation, the system will simply delete the system-inferred redundant equation. For example, the user drew the radii of the arcs close to equal, so the system infers that the radii are equal. However, the user actually defined radius of arc two as twice the radius of arc one. Thus to give the user what he intended, the system-inferred redundant equation is deleted. The system does not generate a message reflecting the conflict because the user never defined the arcs as equal.

Figure 4B:
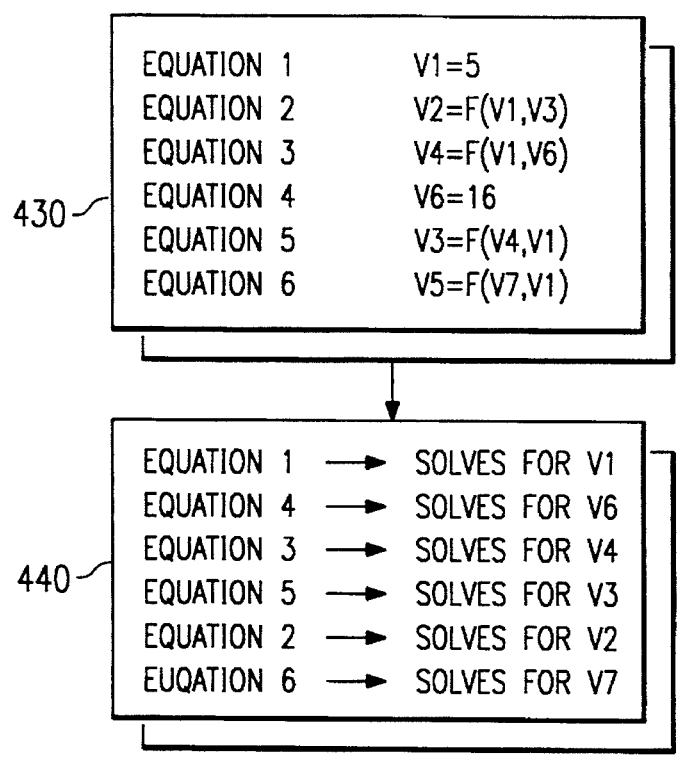
FIG. 4b is a schematic illustration of an example under-populated class of equations, each with their respective solve lists and each according to a preferred embodiment of the present invention.

Looking now at FIG. 4b, which is a schematic illustration of an example under-populated set of equations 430, together with its solved equation list 440, according to a preferred embodiment of the present invention. Again, for the sake of discussion, it will be assumed that such set of equations 430 has been prioritized and includes all classes of equations, including axiom, system-inferred and user-defined equations. As with the example seen in FIG. 4a, the order within the classes of these equations is not important.

In FIG. 4b, the system goes through the same process described in connection with FIG. 4a. However, in this example, equation six remains unsolved, while equations one through five are moved to solved equation list 440. Equation six states that variable V5 is a function of variables V7 and V1. Although the system knows what value to assign to the variable V1 based on the contents of the solved equation list and knows the values for variables V1, V2, V3, V4, and V6, the present system determines the values for variables V5 and V7 are unknown and therefore equation six is unsolved (FIG. 2, Decision block 260).

The system preferably will then fix one of the unknown variables (FIG. 2, Block 270) according to the preferred heuristics listed below, giving the variable the value that the user drew on the screen. For the sake of discussion, assume these heuristics direct the system to assign such a value to variable V5. The system then solves equation six to obtain a value for variable V7 and moves equation six to the solved equations list. Equation six is now considered a supplemental equation. Thus, for an under-populated set of equations, the heuristics of an auto-constrainer (which is a portion of the equation solver of the present invention) direct the system to intelligently and automatically constrain enough variables to force solution to all of the equations provided to the sorting portion of the present system, and thereby enable all non-redundant equations to be moved onto the solved equations list. It should be understood that though the example shows only one underpopulated equation, if there are two or more such elements, the system will set one variable and return to sort and cycle through the remaining underpopulated equations to see whether they now are solved.

The auto-constrainer portion of the present invention is an extension to the equation solver which enables the equation solver to determine a non-imaginary root to a set of under-populated algebraic equations. Supplemental equations are chosen using a set of heuristics that take the geometry described by the original equation set into account. This occurs because supplemental equations have the following desirable characteristics: they do not conflict with equations that are already in the set (e.g., a solution to a supplemental equation will be in the solution space of the original set of equations) and they are naturally decoupled from any equation in the original set of equations (i.e., they may be solved without knowledge of the original set of equations). These characteristics allowed heuristics to be developed that generate a fully populated set of equations that yield an appropriate and desirable solution to the original equation set.

It should be noted that though the present example seen in FIG. 4b is only under-populated, a set of equations may at the same time have redundant equations and be under-populated. This means some variables are known because of more than one equation while other variables remain unknown. The system according to the present invention addresses both of these situations, even when they occur in the same set of equations. However, for ease of understanding, the two situations have been addressed separately in FIGS. 4a and 4b herein.

It should also be understood that while all of the equations are now on the solved equations list, for an under-populated set of equations, the solved equations list never has a complete (fully populated) set of solutions. As can be seen from study of the present example (FIG. 4b), solved equations list 440 has no solved equation for variable V5. Moreover, as previously discussed, the solved equations list is an ordered, linked list of equations used to define the geometry of the desired object which is used by the system to establish the profile of a sketch, even though in the present case, it is an under-populated solved list of equations.

The auto-constrainer of the present invention employs heuristics to decide which unknown variables to fix, given that the set of equations is under-populated. The system preferably assigns values to the unknown variables of the remaining unknown equations in the following order: First to the unknown line angle variables, then to unknown arc radius variables, followed by unknown line length variables. The system afterwards assigns values to unknown arc angle variables, then to unknown line endpoint variables, followed by unknown arc center variables and lastly to unknown spline/conic endpoint variables. It should be understood that the system preferably assigns values to all of the unknown variables in each type of variables before proceeding to the next type. For example if there remained two unknown line angle variables and an unknown arc radius variable, the system would preferably assign values to both of the line angle variables before assigning a value to the unknown arc radius variable.

Before the present invention, a sketch solver was unable to determine any solution to an under-populated set of equations. It was obliged to request more information from the user. However, not only does the present invention find a solution to such a set of equations, but because it uses intelligent heuristics to decide which variables to fix, it normally will find the real root that exists in an equation set as opposed to one which may be imaginary.

It may happen that the system does not generate the results that the user expects. An example of such a situation would be if the user just drew lines and provided the system absolutely no equations (geometric relationships or constraints). In such a situation the system would just fix all the points and display the drawing as the user drew it. Thus, there is never a case when the system cannot solve the set of equations.

After the system and method of the present invention completes sorting of equations and generating the ordered solved equation list (FIG. 2, Block 280), it then solves the equations on the solved equation list for their respective variables (FIG. 2, Block 290). Equations are preferably solved immediately after they are sorted. Specifically, the value for the unknown variable in each solved equation is determined, and these solved variable values form a profile which is used to derive the geometric configuration of the model. The solved equation list does not have much meaning until the equations are solved for their unknown variables. Therefore, using the examples of either FIGS. 4a or 4b, the system begins with equation one which states V1 equals 5. The system sets, or fixes, V1 at 5. The system then proceeds to solve for V6. It should be remembered that each dimensional variable has three coordinates associated with it, so it would be a point (x,y,z). The present discussion has used only one coordinate in the equations, regardless of type of variable, to simplify the explanation. The system continues through the solved equation list, and because it is an ordered list, the system knows which equation to read and solve next. Thus, by using the established value of V1, the system solves equation four and fixes variable V6 equal to 16. As described above, all system-inferred redundant equations are preferably deleted.

Often an equation to be solved will have more than one real root. When this is the case, heuristics are applied to systematically decide which root to choose when solving the equation. The heuristics are based on the position and configuration of the geometry at the time the equation solving capability of the present invention is invoked.

After completing the solving of the sorted equations (FIG. 2, Block 290), the system then updates the variables, rectifies the geometry of the profile of the sketch and regenerates the associated entities. The geometry characteristic data is reconstructed from the new values of associated sketch variables, including redundant constraint equations.

Once the system has completed its processing of equations defining the desired geometric model (FIG. 2, Block 290), the generated profile can be output to workstation 110 and/or mainframe 120 as well as to applications 190,192,194 of FIG. 1. Applications 190,192,194 could be, for example, two-dimensional and three-dimensional geometric modeling exercises which employ profiles.

Assume the user desires to edit a parameter within the profile generated according to the present invention. Before the present invention, if a part needed to be changed, the user had to delete and then recreate the affected geometry. Thus, with the present invention, the user need only edit the desired constraint and the present system automatically resolves all of the affected equations much quicker than previous systems. This is because sorting (FIG. 2, Block 230) is only done when equations have been added or deleted. If the user is just changing variable values, the system preferably does not resort all of the equations but instead merely resolves the solved equations list. For example, if the user edits V1 of equation one to equal 6 instead of 5, the present system corrects the relevant equations on the solved equation list affected by such change, and generates a different code profile. From this profile, the system regenerates a new graphical representation of the desired geometric model.

It will be apparent to those skilled in the art that the present invention may also be employed in other fields. For example, it could be directly applied to solve three-dimensional geometric profiles (as opposed to solving the projections of three-dimensional geometric profiles onto a two-dimensional plane). As another example, the present invention could be applied to resolving sets of algebraic equations describing systems other than geometric profiles of objects. One way this could be accomplished would be by replacing the heuristics used to generate supplemental equations, thus modifying the auto-constraining aspect of the present invention to appropriately supplement equation sets that describe systems other than mechanical designs. Then, by varying the input to the algebraic equations (that is, varying the coefficients and constants in the set of equations), the system and method of the present invention could be used to solve probabilistic mechanics problems, or tolerance stack-up problems, or even operate as part of a Monte Carlo algorithm.

The program listing (found in Appendix A) demonstrates an embodiment of the invention contained therein. It should be understood by those skilled in the art that such is provided only by way of illustrative example and should in no manner be construed to limit the invention as described herein. Numerous modifications and alternate embodiments of the invention will occur to those skilled in the art. Accordingly, it is intended that the invention be limited only in terms of the following claims:

```
/*HEAD SK_UPDATE CCC SKET
/*
 * DESCRIPTION -
 *      This routine sorts equations on a given sketch, determining
 *      which ones to put on the linked list
 *
 *      All parameters are passed by reference.  For FORTRAN
 *      compatability.
 *
 *      Equation subtypes:   0 = regular equation
 *                           1 = 1-variable equation
 *                           2 = header equation
 *                           3 = geometric equation
 *                           8 = dimension equation
 *                           9 = symmetry equation
 *                          10 = inferred equation
 *
 *
 * INPUT -
 *      sk_eid:         Sketch eid
 *      infer_flag:     Inference flag
 *                      =1:  Create/Delete Inferred constraints
 *                      =0:  DO NOT create/delete inferred
 *                           constraints
 *
 *
 * REVISIONS
 *      rev     date    who     reason
 *
 * * * * * * * * * * * * * * * * * * * * * * * * * * * * * * * * * */
#include     <ugmalc.h>
#include     <skupdate.h>
#include     <tolcomh.h>
include     <unidefs.h> void sk_sorter () ;
void sk_add_to_eqn_list () ;

static void del_eqn_from_list () ;
static void add_eqn_to_solved_list () ;

static SK_RECORD **sk_get_eqns ()
;
static int    ZERO = 0;
static int    ONE = 1;
static int    TWO = 2;
static int    THREE = 3;
static int    FOUR = 4;

void FTN (sk_update)
(Sk_eid,infer_flag)
FENTITY     *Sk_eid;
int         *infer_flag;
{
int         ALL, NOTINF, mask,
            i;
```

(C) Copyright 1993 Electronic Data systems Corporation. The copyright owner has no objection to the facsimile reproduction by anyone of the patent disclosure, as it appears in the Patent and trandemark Office patent file or records, but otherwise reserves all copyright rights whatsoever.

Appendix A

```
FINTEGER    zero, under_constrained;
FLOGICAL    lexist;
FENTITY     last_eqn, csyseid, *pl;
SK_RECORD   **unknown_eqns, *temp_pntr, *pntr;

/* Initialize */
        zero = 0;
        ALL = 1803;
        NOTINF = 779;

/* Zero-out linked list */
        FTN (tol365) (Sk_eid,zero,&last_eqn);

/* Delete inferred constraints */
        if (*infer_flag)    el_infer (*Sk_eid);

/* Get unknown equations */
        unknown_eqns = sk_get_eqns (*Sk_eid);

/* Sort equations - Start w/1-variable Equations */
        sk_sorter(unknown_eqns,ALL,VAR1_EQN,1,*infer_flag,&last_eqn);

/* See if sketch is fully constrained */
        FTN (skt107) (Sk_eid,&under_constrained);

/* Sketch is underconstrained, Infer constraints */ if (*infer_flag && under_constrained && AUTOIN==2)
        {
            sk_infer(*Sk_eid,unknown_eqns);
            sk_sorter(unknown_eqns,ALL,INF_EQN,1,*infer_flag,
            &last_eqn);
            FTN(skt107) (Sk_eid,&under_constrained);
        }

/* Sketch is underconstrained, Autoconstrain */ if (under_constrained && AUTOCN==2)
        { if (under_constrained)
            {
            /* Set angle, length, radius, endpoints, etc to
            solved-for */
                sk_ucs3(unknown_eqns,&last_eqn);

FTN(skt107) (Sk_eid,&under constrained);
                sk sorter(unknown_eqns,ALL,AXM_EQN,0,*infer_flag,
                &last_eqn);
                FTN(skt107) (Sk_eid,&under-constrained);
            }
        }

/* Delete all malloced space */
        for (i=0; i<EQN_CLASSES; i++)
            {
```

Appendix A

```
                while (unknown_eqns [i];
                    {
                    temp_pntr          = unknown_eqns [i];
                    unknown_eqns [i]   = unknown_eqns [i] -> next;
                    cm_free(temp_pntr);
                    }
                } cm_free(unknown_eqns);

/* Mark equation list as sorted */
        FTN(estt13) (Sk_eid,&lexist,&csyseid);
        FTN(estc30) (&csyseid,&ONE);

} /* end of sk_update */

/* * * * * * * * * * * * * * * * * * * * * * * * * * * * * * * * * */
/*HEAD SK_GET_EQNS CCC SKET */
/*
|   DESCRIPTION -
|       This routine creates a classified list of all unknown
|       equations belonging to the input sketch.
|
|       Equation subtypes:   0 = regular equation
|                            1 = 1-variable equations
|                              = header equation
|                            8 = dimension equation
|                           10 = inferred equations
|
|   INPUT -
|       sk_eid:         Sketch eid
|
|
|   REVISIONS
|       rev    date    who    reason
|
= = = = = = = = = = = = = = = = = = = = = = = = = = = = = = = = = */
static SK_RECORD **sk_get_eqns(sk_eid)
FENTITY sk_eid;

{
int             i, eq_type, eq_form;
FENTITY         eq_dim, eq_eid;
FINTEGER        subtyp, eqn_type;
FLOGICAL        es8208 (), es8209();

SK_RECORD       *new_rec;
SK_RECORD       **eqn_list_ptrs;

/* Initialize */ eqn_type      = 82;
    eqn_list_ptrs = (SK_RECORD **) UGcalloc (EQN_CLASSES,
    sizeof(SK_RECORD)); for (i=0; i<EQN_CLASSES; ++i)
        {
        eqn_list_ptrs[i] = NULL;
        }
```

Appendix A

```
/* Cycle data base for equations, create unsolved list */ for (eq_eid = NULENT, FTN(es0064) (&eqn_type,&eq_eid);
    /* initializer */ eq_eid; /* continuing cond */
    FTN(es0064) (&eqn_type,&eq_eid)) /* iterator */

{
    if (FTN(es8208) (&eq_eid,&sk_eid) &&
          (subtyp= FTN(es0002) (&eq_eid))    != 2 &&
          (!FTN(es8209) (&eq_eid)))

sk_add_to_eqn_list(eqn_list_ptrs,eq_eid,subtyp);
      }    /* end for loop */ return (eqn_list_ptrs);
} /* end of sk_get_eqns */

/* = = = = = = = = = = = = = = = = = = = = = = = = = = = = = = = = = */
/*HEAD SK_SORTER CCC SKET */
/*
    DESCRIPTION -
        This routine sorts equations by class order.

DEVELOPER'S NOTES -
        Every time an equation is added to the linked solved list, the
            list of equations is re-sorted (beginning with class 0).

INPUT -
        eqn list:      List of unknown equations
        mask:          Bit Mask of which equations to sort
        start:         Start class to begin sorting
        sflag:         Whether or not to add wvar, wcor solved info
                       onto sketch equation
                           =0:  no
                           =1:  yes
        iflag:         Interference Flag
                           =0:  do NOT delete redundant inferred eqns
                           =1:  delete redundant inferred eqns INPUT/OUTPUT -
        last_eqn:      Last equation on linked list REVISIONS
            rev    date       who         reason

= = = = = = = = = = = = = = = = = = = = = = = = = = = = = = = = = */ void sk_sorter(eqn_list, mask, start, sflag, iflag, last_eqn)
SK_RECORD        **eqn_list;
int              mask, start;
int              sflag, iflag;
FENTITY          *last_eqn;
{
FENTITY eq_eid, dim, lequ, cequ;

FINTEGER    add_eqn;              /* Number of equations that can be
                                     added to the solved link list */
```

Appendix A

```
FINTEGER    type;
FENTITY     svar;
FLOGICAL    es8208 (), es8209 ();

int     inval;
int     i, inx, ind, jnx, knx, class, solv_array[30];
int     index[2], edform, unsol, form, scor;
int     vdat[MAX_SIM_EQN*MAX_VAR*3], cdat[MAX_SIM_EQN*MAX_VAR*3];
int     eqn_info[2];
int     eforms[MAX_SIM_EQN], etypes[MAX_SIM_EQN], eqnumv[MAX_SIM_EQN];
int     scors[MAX_SIM_EQN];
int     sim_flag, total;
int     eqn_from_class_added;
FREAL   svals[MAX_SIM_EQN];

FENTITY eqvars[MAX_VAR*MAX_SIM_EQN], eqeids[MAX_SIM_EQN];
FENTITY svars[MAX_VAR*MAX_SIM_EQN];

FREAL   sval;

SK_RECORD   *header, *pntr, *delete_pntr;

/* Initialize */ index[0] = 2;
        index[1] = 2;
        sim_flag = 0;

/*  Cycle equations  */

/*  Get first header eqn */
        for (i-start, class=start,header=eqn list[i];
        (((!header) || (!btest(mask,i))) && i <= EQN_CLASSES-1);
        ++i)
        {
        header = eqn_list[i];
        class = i;
        } while(header)
    {
        eqn_from_class_added = 0;
        for (pntr = header, delete_pntr = NULL; pntr; pntr=pntr->next)

{
            add_eqn = 0;

if (delete_pntr)
                del_eqn_from_list(delete_pntr,class,eqn_list);
            delete_pntr = NULL;

eforms[0] = pntr->form;
            etypes[0] = pntr->type;
            eqeids[0] = pntr->eqn;
            eqnumv[0] = pntr->nvar;
```

Appendix A

```
            for (jnx] = 0; jnx < eqnumv[0];  ++jnx)
                eqvars[jvx] = pntr->vars[jnx];

FTN(sk_sort_eqn)(&eqeids[0],&etypes[0],&eforms[0],&eqnumv[0],
                    &eqvars[0],solv_array,&unsol,vdat,cdat);

/* If number of unsolveds is zero, equation is redundant --
        remove equation from unknown list
   If number of unsolveds is one, determine validity of
        equation if equation is valid, add to solved link list.
        Remove equation from unknown list.
   If number of unsolved exceeds one, determine if equation
        can be simultaneously solve with other equations.
        If it can, add the eqn to the solved link list and remove
        it from the unknown list. Else, do nothing.        */ switch    (unsol)
    {
            /*  Redundant Equation, edit dim to red   */ case 0:    sk_edit_color(pntr,3);
                    if (class == INF_EQN && iflag)
                        FTN(es8290) (&pntr->eqn);
                    delete_pntr = pntr;
                    break;

/* Only one unknown, determine validity of euqation */ case 1:    FTN(sk_solv_eqn) (&eqeids[0],&etypes[0],
                                    &eqvars[0], &eforms[0],
                                    index, &inval, &svars[0],
                                    &scors[0], &svals[0];
                    if (!inval)
                    {
                        add_eqn = 1;
                        sk_edit_color(pntr,2);
                        delete_pntr = pntr;
                    }
                    break;

/*  More than one unknown.  First determine if the
                euqation can be solved by itself.  If not,
                determine if the equation can be simultaneously
                solved   */ default    f(FTN(sk_sort_special_eqn_eqeids[0],etypes[0],
                            eforms[0],eqvars,&unsol,vdat,cdat))

{
                        add_eqn = 1;
                        sk_edit_color(pntr,2);
                        delete_pntr = pntr;
                    }
```

Appendix A

```
                else
                {
                        if ((sim_flag) && sk_sim_sort_eqns(eqeids,
                                etypes,eforms,eqnumv,eqvars,solv_array,
                                &unsol,vdat,cdat))
                        {
                                add_eqn = unsol;
                                sk_edit_color(pntr,2);
                                delete_pntr = pntr;
                        }
                        else
                        {
                                sk_edit_color(pntr,4);
                        }
                }
                break;

}
/* Add equation to solved list.  Edit solved-for flag,
   Edit form of equation, edit solved information  */ if (add_eqn)
        {
                eqn_from_class_added = 1;

/*      Edit equation form   */ for (inx = 0; inx < add_eqn; ++inx)
                {
                        FTN(to1299) (&FOUR,&etypes[inx],&edform);
                        if (edform) FTN(es8221) (&eqeids[inx],&eforms[inx]);
                }

/*      Edit variable solved-for flag   */ for (inx = 0; inx < unsol; ++inx)
                        FTN(es8321) (&vdat[inx],&cdat[inx],&ONE);

/*      Add which var - which coordinate information to the first
                equation   */ if (sflag)
                {
                        total = 0;
                        for (inx = 0; inx < add_eqn; ++inx)
                                total = total + eqnumv[inx];

for (inx = 0; inx < unsol; ++inx)
                        {
                                for (jnx = 0; jnx < total; ++jnx)
                                {
                                        if (vdat[inx] == eqvars[jnx])
                                        {
                                                eqn_info[0] = jnx + 1;
                                                eqn_info[1] = cdat[inx];
                                                break;
```

Appendix A

```
                    }
                }
                FTN (es8207) (&eqeids[0],eqn_info);
            }
        }

FTN(es8202) (last_eqn,&pntr->eqn);
        *last_eqn = pntr->eqn;

/* Resort equations starting with class 0  */
        if (class > VAR1_EQN) break;
        }

}   /* end for loop   */

/* Remove Equation from unknown list   */ if (delete_pntr)
        del_eqn_from_list(delete_pntr,class,eqn_list);
    delete_pntr = NULL;

/* Equation (in class) was added, recycle equations, beginning with
   equation class 0   */

If (eqn_from_class_added)
        for   (i=0,class=i,header=eqn_list[i];
        (((!header) || (!btest(mask,i))) && i <= (EQN_CLASSES=1));
        ++i,class=i,header = (i>(EQN_CLASSES-1))?NULL:eqn_list[i]);

/* No equation (in class) was added start cycling next class of
   equations   */ else
    {
        class = class+1;
        for (i=class,header=(1>(EQN_CLASSES-1))?NULL:eqn_list[i];
          (((!header) || (!btest(mask,i))) && i <= (EQN_CLASSES-1));
          ++i,class=i,header=(i>(EQN_CLASSES-1))?NULL:eqn_list[i]);

/*  No more equations can be solved solitairily, start
        solving equations using simultaneous solver (before any
        inferred equations are added to the solved list)   */ if ((!header || class >=INF_EQN)  && !sim_flag)
        {
            class = 0;
            header = eqn_list[class];
            sim_flag = 1;
        }
    }
    }  /* end while loop  */

}  /* end of sk_sorter  */
```

Appendix A

```
/* = = = = = = = = = = = = = = = = = = = = = = = = = = = = = = = = =
|   del_eqn_from_list
|
|       This function dele_____ an equation cell from the
|       list of unknown equations.
|
    = = = = = = = = = = = = = = = = = = = = = = = = = = = = = = = = = */ static void      del_eqn_from_list(eqn_ptr,eqn_class,eqn_list_heads)
SK_RECORD              *eqn_ptr, **eqn_list_heads;
int                    eqn_class;
{
SK_RECORD       *del_ptr;

/* Remove equation from unknown list */ del_ptr = eqn_ptr;
        if (eqn_ptr->prev)
             eqn_ptr->prev->next = eqn_ptr->next;
        else
             eqn_list_heads[eqn_class] = eqn_ptr->next;

if (eqn_ptr->next)
             eqn_ptr->nxt->prev = eqn_ptr->prev;

cm_free(del_ptr);

} /* end remove_eqn */

/* = = = = = = = = = = = = = = = = = = = = = = = = = = = = = = = = =
|   sk_add_to_eqn_list
|
|       This function adds an equation an equation cell to the
|       list of unknown equations.
|
|       INPUT -
|
|               eqn_list         List of Equation
|               eqn_sub          Equation Subtype
|               eqn_eid          Equation Eid
|
    = = = = = = = = = = = = = = = = = = = = = = = = = = = = = = = = = */ void sk add_to_eqn_list(eqn_list,eqn_eid,eqn_sub)
SK_RECORD              **eqn_list;
FENTITY                eqn_eid;
int                    eqn_sub;
{
FENTITY         eqn_dim;
int             eqn_type, eqn_form;
SK_RECORD       *new_rec;

new_rec=(SK_RECORD *) cm_malloc(sizeof(SK_RECORD));
        FTN(es8217) (&eqn_eid,&eqn_dim);
        FTN(es8219) (&eqn_eid,&eqn_type,&eqn_form);
```

Appendix A

```
        new_rec->eqn                    = eqn_eid;
        new_rec->subtype                 = eqn_sub;
        new_rec->type                    = eqn_type;
        new_rec->form                    = eqn_form;
        new_rec->dim                     = eqn_dim;
        FTN(es8223) (&eqn_eid,&new_rec->nvar,&new_rec->vars);
        new_rec->prev                    = NULL;
        new_rec->next                    = NULL;
        if (!eqn_list[eqn_-----1)
            {
            eqn_list[eqn_sub]            = new_rec;
            }
        else
            {
            eqn_list[eqn_sub]->prev      = new_rec;
            new_rec->next                = eqn_list[eqn_sub];
            eqn_list[eqn_sub]            = new_rec;
            }

}  /* and sk_add_to_eqn_list */ static void print eqn_class(list_head)
SK_RECORD            *list_head;
{
SK_RECORD            *pntr;
int                  count;

count = 0;
        pntr = list_head;
        while (pntr)
        {
            count++;
            printf("Equation Eid - %1d; Equation Type - %1d/n",
            pntr->eqn, pntr->t pntr = pntr->next;
        }
        printf("Number of equations = %1d/n", count);
}
```

We claim:

1. A processing system for parametric modelling of an object defined by a profile, comprising:
   an equation definer for receiving input from a user in the form of equations and generating axiom and system-inferred equations;
   an equation prioritizer for receiving all of said equations from said equation definer and prioritizing each of them based on whether it is a user-defined, axiom or system-inferred equation;
   an equation sorter for receiving said prioritized equations from said equation prioritizer and creating an ordered equation list therefrom;
   an equation solver for receiving said ordered equation list from said equation sorter and solving said equations in the order they appear on said ordered equation list; and
   a sketch generator for receiving solutions of said solved equations and generating a profile constructed therefrom.

2. The processing system for parametric modelling of an object of claim 1, wherein said equation sorter further comprises a redundant equation list generator for generating a list of redundant equations.

3. The processing system for parametric modelling of an object of claim 2, wherein said equation sorter further comprises a redundant equation processor for comparing equations from said redundant equation list with equations from said ordered equation list to check for variable value conflicts, sending a message to said user if a conflict exists between user-defined equations, and deleting a conflicting system-inferred equation created during said step of generating if a conflict exists between at least one user-defined equation and said conflicting system-inferred equation.

4. The processing system for parametric modelling of an object of claim 2, wherein said equation sorter further comprises a redundant equation processor for comparing equations from said redundant equation list with equations from said ordered equation list to check for variable value conflicts.

5. The processing system for parametric modelling of an object of claim 1, wherein said equation solver further comprises an automatic constrainer for setting at least one unknown variable within at least one unsolved equation equal to a predetermined geometric constraint when said prioritized equations are a set of under-populated equations.

6. The processing system for parametric modelling of an object of claim 1, wherein said equation prioritizer assigns higher priority to all user-defined equations than any system-inferred equations.

7. The processing system for parametric modelling of an object of claim 6, wherein said equation prioritizer further assigns higher priority to all axiom equations than any user-defined equations.

8. The processing system for parametric modelling of an object of claim 1, wherein said equation sorter further comprises a equation list generator for cycling through each of said classes of equations beginning with those equations with highest priority and generating an ordered linked list of equations by skipping any equation with a plurality of unknown variables, adding an equation to said equation list if a single unknown variable in the equation can be isolated, and returning to any skipped equation in the order such equation was skipped to see whether it now has only a single unknown variable based on equations since added to said equation list.

9. A method for a computing system to solve a set of equations describing a profile, comprising the computer-performed steps of:
   receiving input from a user in the form of equations;
   generating axiom and system-inferred equations;
   prioritizing each of all said equations based on whether it is a user-defined, axiom or system-inferred equation;
   creating an ordered equation list from said prioritized equations;
   solving said prioritized equations in the order they appear on said ordered equation list; and
   generating a profile constructed from the solutions of said solved equations.

10. The method for a computing system to solve a set of equations describing a profile of claim 9, said step of creating an ordered equation list further comprising the step of generating a list of redundant equations.

11. The method for a computing system to solve a set of equations describing a profile of claim 10, further comprising the step of checking for variable value conflicts between said redundant equations and said solved equations.

12. The method for a computing system to solve a set of equations describing a profile of claim 11, wherein said step of creating an ordered equation list further comprising the steps of sending a message to said user if a conflict exists between user-defined equations and deleting a conflicting system-inferred equation created during said step of generating axiom and system-inferred equations if a conflict exists between at least one user-defined equation and said conflicting system-inferred equation.

13. The method for a computing system to solve a set of equations describing a profile of claim 9, wherein said step of solving said equations further comprising:
   automatically constraining at least one unknown variable within at least one unsolved equation when said set of equations describing a profile is under-populated.

14. The method for a computing system to solve a set of equations describing a profile of claim 9, wherein said step of prioritizing said equations assigns higher priority to all user-defined equations than any system-inferred equations.

15. The method for a computing system to solve a set of equations describing a profile of claim 14, wherein said step of prioritizing said equations further assigns higher priority to all axiom equations than any user-defined equations.

16. The method for a computing system to solve a set of equations describing a profile of claim 9, wherein said step of creating an ordered equation list further comprising the steps of:
   cycling through each of said prioritized equations beginning with those equations with highest priority; generating an ordered linked list of equations by:
      adding an equation to said equation list if a single unknown variable in the equation can be isolated;
      skipping any equation with a plurality of unknown variables; and
      returning to any skipped equation in the order such equation was skipped to see whether such skipped equation now has only a single unknown variable based on equations since added to said equation list; and
   stopping said cycling and said generating of an ordered equation list when it is not possible to add another equation to said equation list.

17. The method for a computing system to solve a set of equations describing a profile of claim 16, wherein said step of creating an ordered equation list further comprising the step of:

for each equation with only one unknown variable, rewriting said equation in such a form that said unknown variable is isolated before continuing with said cycling step.

18. A method for a computing system to solve a set of equations describing a profile, comprising the computer-performed steps of:

receiving input in the form of equations;

prioritizing each of all said equations based on whether it is a user-defined, axiom or system-inferred equation;

creating an ordered equation list from said prioritized equations;

solving said prioritized equations in the order they appear on said ordered equation list; and generating a profile constructed from the solutions of said solved equations.

* * * * *